United States Patent [19]

Kitamura

[11] Patent Number: 5,374,587
[45] Date of Patent: Dec. 20, 1994

[54] METHOD OF MANUFACTURING OPTICAL SEMICONDUCTOR ELEMENT

[75] Inventor: Shotaro Kitamura, Tokyo, Japan

[73] Assignee: NEC Corporation, Japan

[21] Appl. No.: 920,880

[22] Filed: Jul. 28, 1992

[30] Foreign Application Priority Data

Jul. 31, 1991 [JP] Japan .................. 3-216027

[51] Int. Cl.⁵ .......................... H01L 21/20
[52] U.S. Cl. .................... 437/89; 437/129; 437/133; 148/DIG. 26
[58] Field of Search .......... 437/89, 129, 133, 126, 437/127, 128, 132; 372/45; 148/DIG. 26, DIG. 99

[56] References Cited

U.S. PATENT DOCUMENTS

| | | | |
|---|---|---|---|
| 4,077,817 | 3/1978 | Bellavance | 437/129 |
| 4,946,802 | 8/1990 | Shima et al. | 437/129 |
| 4,950,622 | 8/1990 | Kwon et al. | 148/DIG. 95 |
| 5,026,662 | 6/1991 | Westbrook | 437/129 |
| 5,028,562 | 7/1991 | Shima | 437/129 |
| 5,045,500 | 9/1991 | Mitsui et al. | 437/129 |
| 5,070,510 | 12/1991 | Konushi et al. | 372/45 |
| 5,179,566 | 1/1993 | Iwana et al. | 372/45 |
| 5,250,462 | 10/1993 | Sasaki et al. | 148/DIG. 26 |
| 5,258,326 | 11/1993 | Morishima et al. | 437/107 |

OTHER PUBLICATIONS

K. Magari et al. "Polarization Insensitive Traveling wave Type Amplifier Using Strained Multiple Quantum Well Structure", IEEE Photonics Technology Letters vol. 2 (1990) pp. 556–558.

M. S. Lin et al. "Temperature Dependence of Polarization Characteristics in Buried Facet Semiconductor Laser Amplifiers", IEEE Journal of quantum Electronics vol. 26 (1990) pp. 1,772–1,778.

I. Cha et al. "1.5 $\mu$m Band Travelling-Wave Semiconductor Optical Amplifiers with Window Facet Structure", Electronic Letters vol. 25 (1989) No. 18 pp. 1,241–1,242.

S. Cole et al. "Polarisation-Insensitive, Near-Travelling-Wave Semiconductor Laser Amplifiers at 1.5 $\mu$m", Electronics Letters vol. 25 (1989) pp. 314–315.

N. A. Olsson et al. "Polarisation-Independent Optical Amplifier with Buried Facets", Electronics Letters vol. 25 (1989) pp. 1,048–1,049.

T. Kato et al. "DFB-LD/Modulator Integrated Light Source by Bandgap Energy Controlled Selective Movpe", Electronics Letters vol. 28 (1992) pp. 153–154.

Y. D. Galeuchet et al. "Selective area MOVPE of GaInAs/InP heterostructures on masked and nonplanar (100) and (111) substrates", Journal of Crystal Growth vol. 107 (1991) p. 147.

Primary Examiner—Brian E. Hearn
Assistant Examiner—Michael Trinh
Attorney, Agent, or Firm—Laff, Whitesel, Conte & Saret, Ltd.

[57] ABSTRACT

In a method of manufacturing an optical semiconductor element including at least the steps of forming a mask having a stripe-like gap or interval on a semiconductor substrate, epitaxially growing a semiconductor ridge including an active layer on only an exposed gap portion of the semiconductor substrate, and epitaxially growing a semiconductor cladding layer to cover the ridge, the thickness of the active layer is substantially the same as the width of the active layer.

1 Claim, 4 Drawing Sheets

METHOD OF MANUFACTURING OPTICAL SEMICONDUCTOR ELEMENT

BACKGROUND OF THE INVENTION

The present invention relates to a method of manufacturing an optical semiconductor element and, more particularly, to a method of manufacturing an optical semiconductor element having an epitaxially grown ridge.

As an optical amplifier, a rare-earth (Er, Nd, or the like) added optical fiber amplifier, and a semiconductor laser amplifier (to be abbreviated to as an LD amplifier hereinafter) are expected to be useful in optical communications. Of these amplifiers, an LD amplifier especially has compactness so that it should be appropriate to compact integrated components, and can cope with any wavelengths for optical communications. Thus, various techniques associated with LD amplifiers have been developed, and the following technical reports have been announced.

1) K. Magari et. al. IEEE photonics Technology Letters Vol. 2 (1990) pp. 556
2) M.S. Lin et. al. IEEE Journal of quantum Electronics Vol. 26 (1990) pp. 1,772–1,778
3) I. Cha et. al. Electronic Letters Vol. 25 (1989) No. 18 pp. 1,241–1,242
4) S. Cole et. al. Electronics Letters Vol. 25 (1989) pp. 314–315
5) N. A. Olsson Electronics Letters Vol. 25 (1989) pp. 1,048–1,049

When an LD amplifier is put into a practical application, the improvement of the gain, a decrease in dependency of the gain on polarization of incident light (polarization dependency; a TE-TM gain difference), and a decrease in ripple of the gain depending on the wavelength of incident light should be attained. In the references 1 and 2, the polarization dependency can be almost eliminated, and a sufficient internal gain (up to 25 dB) is obtained. In the reference 3, the ripple of the gain is almost eliminated.

The polarization dependency of the gain in the LD amplifier is eliminated by adopting a strained quantum well structure (reference 1), a buried double-hetero structure having an active layer with a small width (up to 4,000 Å or less) (reference 2), or a structure having a thick active layer (reference 4). However, for these conventional structures, there are the following problems. In the LD amplifier using the strained quantum well structure of the reference 1, it is difficult to grasp the proper composition of the layers, and to control the composition on the manufacturing. Therefore, the demand has arisen for a method allowing easier manufacturing.

The LD amplifier having the narrow active layer of the reference 2 has a difficulty in its manufacturing process, and it is difficult to form this LD amplifier with good reproducibility. When the narrow active layer is formed, a compound semiconductor including the active layer is incised into a narrow (4,000-Å wide) mesa-stripe shape. It is very difficult to realize this incision process by a conventional wet etching process with good reproducibility.

In the LD amplifier having the thick active layer of the reference 4, since the injected carrier density in the active layer is decreased upon driving of the LD amplifier, a decrease in gain inevitably occurs. For the above-mentioned causes, it is not easy to manufacture an LD amplifier, which has a small polarization dependency, and can provide a sufficient gain (up to 20 dB or higher), by the conventional technique.

As a problem on the characteristics of the LD amplifier, the ripple of the gain must be considered. The ripple is caused by reflection of signal light propagating through a waveguide in the amplifier on the facet of an LD amplifier element.

SUMMARY OF THE INVENTION

It is a principal object of the present invention to provide a method of manufacturing an optical semiconductor element, which is free from polarization dependency and ripples, and can provide a sufficient gain.

Therefore, according to one aspect of the present invention, there is a method of manufacturing an optical semiconductor element including at least the steps of forming a mask having a stripe-like gap or interval on a semiconductor substrate, epitaxially growing a semiconductor ridge including an active layer only on gap or interval portion of the semiconductor substrate, and epitaxially growing a semiconductor cladding layer to cover the ridge, wherein a width of the active layer is less than 5,000 Å.

The polarization dependency of the gain of an LD amplifier having a bulk active layer is caused by the fact that the ratio of light (propagating wave) confined in a region where optical amplification is performed (active layer) (i.e., optical confinement ratio) has a polarization dependency. Normally, for an LD amplifier having a buried bulk active layer, TE light has a confinement ratio in the stacking direction which is larger than the confinement ratio of TM light. The optical confinement ratio is associated with the ratio of light leaking and propagating outside the active layer. The larger ratio of such leaking light is larger for the TM light than it is for the light. For the same reason, as for the LD lateral direction (the widthwise direction of the double-hetero active layer), however, the leaking ratio of TM light is smaller than that of TE light, and this fact compensates for a small optical confinement ratio of TM light in the stacking direction. As for the total polarization dependency of the optical confinement ratio on a region where optical amplification is performed, since the influence of the confinement ratio in the stacking direction is dominant, the optical confinement ratio of TE light is higher than that of TM light. For this reason, the gain of TE light is larger than that of TM light.

In order to eliminate the polarization dependency of the gain, the width of the active layer should be decreased to be as small as about 5,000 Å, so that the sectional shape of the active layer approaches to a symmetrical sectional shape, thereby decreasing the polarization dependency of the optical confinement ratio in the active layer. According to the present invention, the active layer having the above-mentioned sectional shape can be formed without posing a problem in its manufacturing process.

According to the present invention, owing to the characteristics of epitaxial growth, a ridge having an active layer can be epitaxially grown on a semiconductor substrate, so that the ridge width is decreased toward the upper portion of the ridge. As shown in FIG. 1, the ridge is epitaxially grown on an exposed (100) surface between the masks which have a stripe-like gap or interval in a (011) direction. The ridge has (111) side surfaces and is formed at 55° direction. By utilizing these characteristics, an active layer having an desired (small) width can be easily formed at an desired level by controlling the growth conditions.

The ripples of the gain are caused by reflection of a propagating wave on the facet of the LD amplifier. In order to eliminate reflection on the facet, it is effective to form a window structure where the active layer as a waveguide disappears.

DESCRIPTION OF THE PREFERRED EMBODIMENTS

The preferred embodiments of the present invention will be described below with reference to the accompanying drawings.

Figure 1:
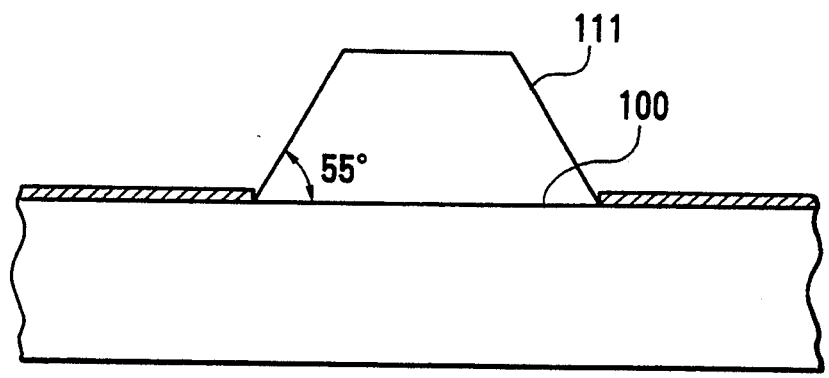
FIG. 1 is a sectional view showing a ridge formed in an epitaxial growth process according to the present invention.
Figure 2:
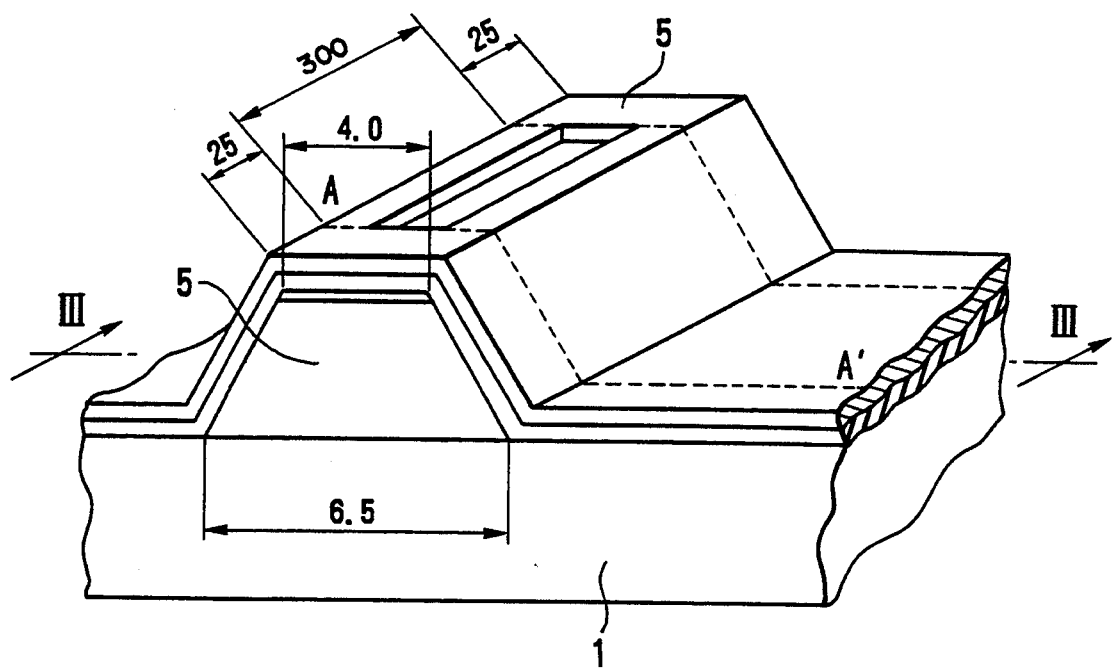
FIG. 2 is a perspective view showing an LD amplifier manufactured by a method according to an embodiment of the present invention.
Figure 3:
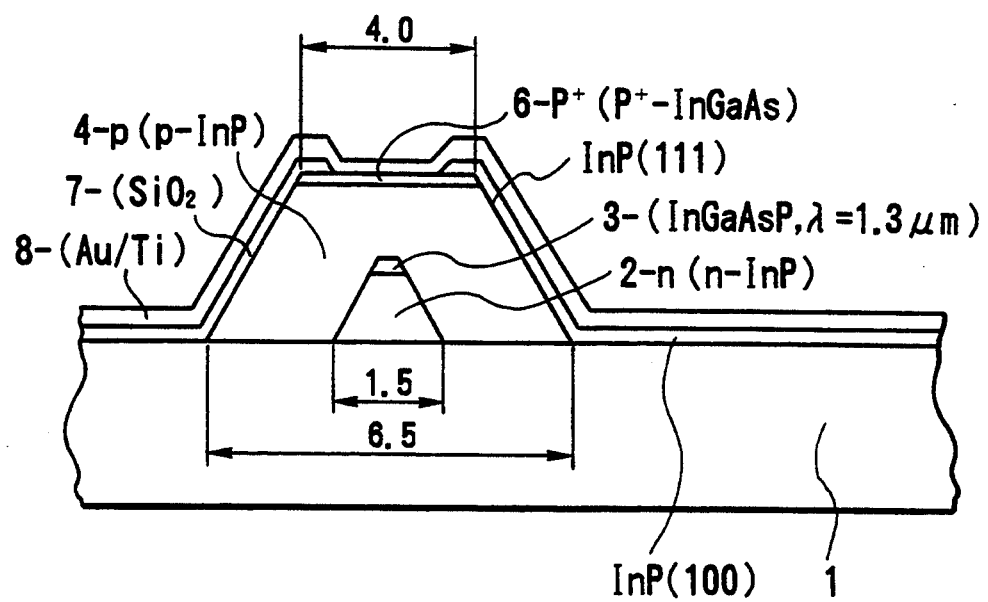
FIG. 3 is a sectional view of the LD amplifier taken along a plane including a line A-A' in FIG. 2, and perpendicular to a substrate.

FIG. 2 shows an LD amplifier manufactured by a method according to an embodiment of the present invention. FIG. 3 shows the sectional structure of the LD amplifier cut along a plane parallel to a line A-A' in FIG. 2 and perpendicular to the surface of a substrate 1. This LD amplifier is manufactured in the following procedure.

Figure 4:
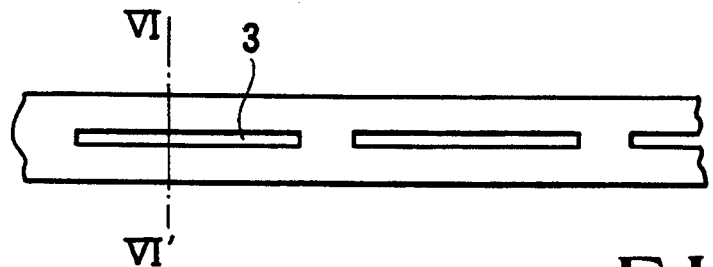
FIG. 4 is a top view of a substrate formed with a mask according to the embodiment shown in FIG. 2.

(1) A mask of a 21.5-$\mu$m wide stripe-like SiO$_2$ thin film having a gap portion with a width of 1.5 $\mu$m and a length of 300 $\mu$m is formed on the surface (100 surface) of an n-type InP substrate 1 (FIG. 4). The stripe-like SiO$_2$ thin film is formed by a thermal CVD method at a temperature of 375° C. using an (SiO$_2$+O$_2$) normal pressure gas as a source gas. At this time, the thickness of the SiO$_2$ thin film is about 1,000 Å. Thereafter, the mask is formed via a conventional resist process and an SiO$_2$ etching process by a dilute hydrogen fluoride solution treatment. This method is known to those who are skilled in the art.

Figure 5:
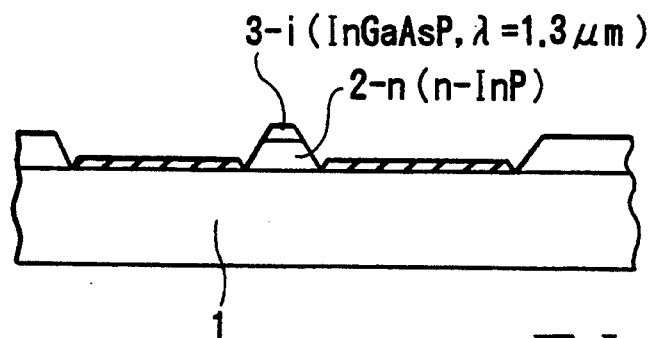
FIG. 5 is a sectional view, taken along a position V-V' in FIG. 4, of the substrate formed with a ridge according to the embodiment shown in FIG. 1.

(2) Epitaxial growth is selectively performed on the gap portion from which the surface of the substrate is exposed, thereby forming a ridge including an n-type cladding layer 2 and an i-type active layer 3. The active layer 3 has a thickness of 2,000 Å, and a width of 4,000 Å (FIG. 5). This epitaxial growth implies the following phenomenon. That is, when the substrate is heated in a source gas atmosphere with semiconductor composition, the source gas is decomposed, and the components of the semiconductor are deposited. With this epitaxial growth, a semiconductor layer having a pyramid-like section is formed, as shown in FIG. 5. Layers formed on the outer sides of the mask are those which are inevitably formed when a ridge is epitaxially grown, and which have no influence to the functions of the LD amplifier.

As for epitaxial growth adopted in the method of the present invention, the following reports are known.

6) T. Kato et. al. Electronics Letters Vol. 28 (1992) pp. 153

7) Y. D. Galeuchet et. al. Journal of Crystal Growth Vol. 107 (1991) pp. 147

Figure 6:
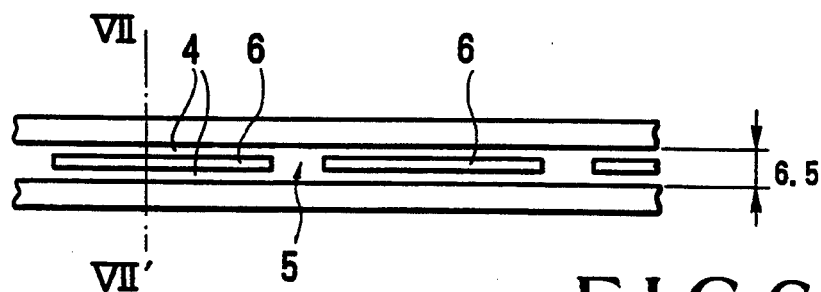
FIG. 6 is a top view of the substrate when an inner portion of the mask is etched.

(3) The inner portion of the mask is etched to widen the gap portion to 6.5 $\mu$m (FIG. 6). In this case, since SiO$_2$ is used as the mask, a dilute hydrogen fluoride solution is used as an etching solution.

Figure 7:
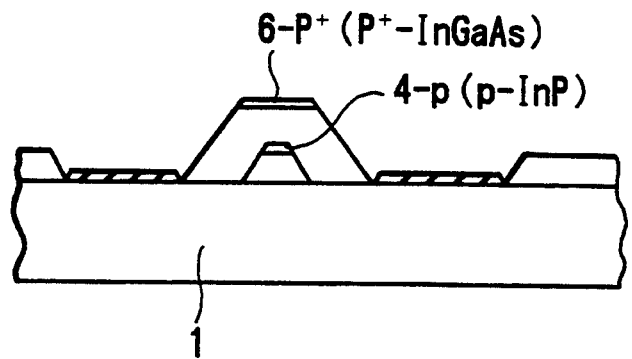
FIG. 7 is a sectional view of the substrate when another epitaxial growth is performed on the substrate shown in FIG. 6.

(4) A p-type p$^+$-type/InP InGaAs layer is epitaxially grown on the gap portion widened to 6.5 $\mu$m so as to cover the ridge, thereby simultaneously forming a p-type cladding layer 4 and a window structure 5. Furthermore, a p$^+$-type capping layer 6 is formed. This state is shown in FIG. 7. The window structure 5 is named after a structure in which when the p-type cladding layer 4 is deposited on a portion between the two ridge ends, no i-type active layer 3 is present on this portion. When an LD amplifier is finally incised from the substrate, the substrate is cleaved at the central line of this window structure portion. Therefore, the window portion is present at the end of the LD amplifier, and a facet where the active layer disappears at this end portion is also called a window facet. This window structure can provide an effect for decreasing the ratio at which waveguide light (light propagating along the optical waveguide of the element) is reflected by the facet, and is returned to the waveguide, i.e., the facet reflectance.

Figure 8:
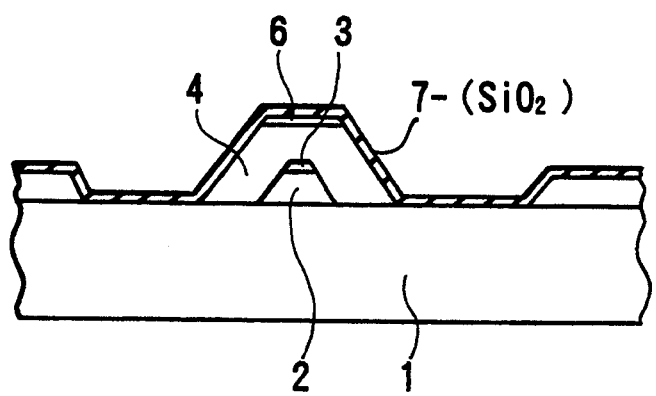
FIG. 8 is a sectional view of the substrate obtained by forming an insulating film 7 on the structure shown in FIG. 7.

(5) The entire surface of the substrate is covered with an SiO$_2$ insulating film 7 (FIG. 8). The SiO$_2$ thin film is formed of the same material as that of the mask, and is formed by, e.g., the thermal CVD method at a temperature of 375° C. using an (SiO$_2$+O$_2$) normal pressure gas as a source gas. At this time, the thickness of the SiO$_2$ thin film is about 2,000 Å.

Figure 9:
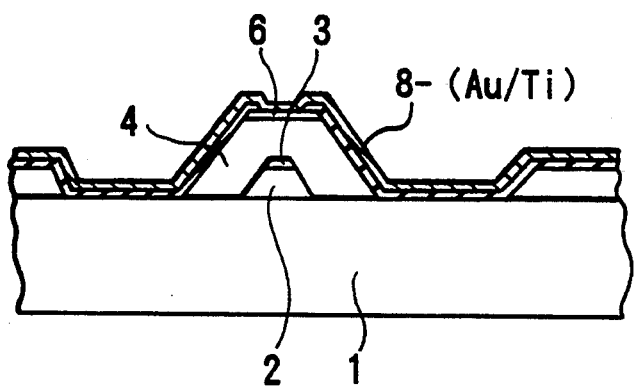
FIG. 9 is a sectional view of the substrate obtained when the insulating layer 7 is removed on the upper surface of a capping layer 6, and an electrode 8 is formed.

(6) A portion of the insulating film 7 on the upper surface of the p$^+$-type capping layer 6 is removed by etching. In this case, insulating film is SiO$_2$. A remove of SiO$_2$ film is taken via a conventional resist process and an SiO$_2$ etching process by a dilute hydrogen fluoride solution treatment. This method is known to those who are skilled in the art. Thereafter, an Au/Ti electrode 8 is formed on the surface including the exposed p$^+$-type capping layer 6 (FIG. 9). In this case, an Au layer has a thickness of 4,000 Å, and a Ti layer has a thickness of 500 Å.

(7) The resultant structure is incised into a 350-$\mu$ long element by cleavage. The incised state is shown in FIG. 2, and FIG. 3 shows a section taken along a line A-A' in FIG. 2.

(8) An AR (anti-reflection) coating is formed on the two facets (cleaved surfaces) of the incised element. In this treatment, an SiO$_x$N$_x$ layer having a refractive index=1.85 is deposited by an ECR plasma facility. At this time, the thickness of the $SiO_xN_x$ layer is about 1,800 Å.

The characteristics of an optical amplifier element (LD amplifier) manufactured in the above-mentioned procedure were evaluated. As a result, when a laser beam having a wavelength of 1.3 μm was incident on the optical amplifier element at an injection current of 120 mA, characteristics having an internal gain of 20 dB or higher, a polarization dependency (TE-TM gain difference) of 1.5 dB or less, and ripples of about 0.05 dB could be obtained.

This embodiment is not limited to the compositions of the illustrated active layer, cladding layer, capping layer, and window structure portion.

Furthermore, an insulating film other than $SiO_2$ may be used as the insulating film.

In this embodiment, an electrode having another composition may be used.

This embodiment is not limited to any scales of mask width gap between the mask and mask thickness.

The above embodiment relates to a method of manufacturing an LD amplifier with a window structure described in the claim appended hereto, and element characteristics. An LD amplifier having no window structure is manufactured by the following manufacturing method.

Figure 10:
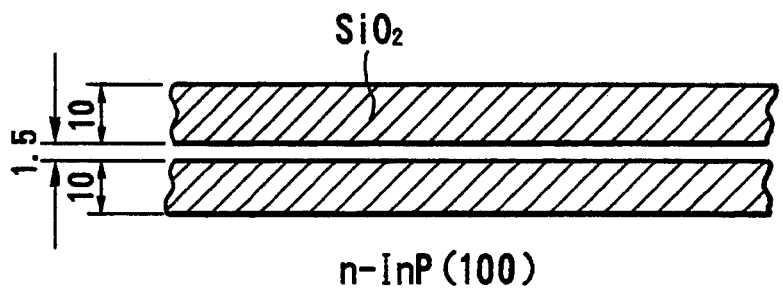
FIG. 10 is a top view of a substrate formed with a mask according to another embodiment of a method of the present invention adopting a structure having no window structure.

(1) Two 10-μm wide stripe-like $SiO_2$ thin films are formed as masks on the surface (100 surface) of an n-type InP substrate 1 to have an interval of 1.5 μm therebetween (FIG. 10).

Thereafter, the LD amplifier is manufactured following the same procedures as in paragraph (2) and subsequent paragraphs above. However, in paragraph (4), a window structure is not formed.

The LD amplifier having no window structure manufactured in the above-mentioned procedure was evaluated. As a result, when a laser beam having a wavelength of 1.3 μm was incident on the optical amplifier element at an injection current of 120 mA, characteristics having an internal gain of 20 dB or higher, a polarization dependency (TE-TM gain difference) of 1.5 dB or less, and a ripple of about 0.5 dB could be obtained.

According to the present invention, an LD amplifier having a sufficient gain, small polarization dependency of the gain, and small ripple of the gain can be manufactured easily even in terms of processes.

What is claimed is:

1. A method of manufacturing an optical semiconductor element comprising at least the steps of:
    forming a mask having at least two stripe-like gaps on a semiconductor substrate;
    epitaxially growing a semiconductor ridge including an active layer only in each of said gaps, wherein said active layer having a width which is less than 5000 Å;
    etching an inner portion of said mask to widen said gaps and removing a portion of said mask between two ridge ends; and
    epitaxially growing a semiconductor cladding layer to cover said semiconductor ridges, and thereby forming a window structure between said two ridge ends.

* * * * *